United States Patent [19]

Gill

[11] Patent Number: 5,245,212
[45] Date of Patent: Sep. 14, 1993

[54] SELF-ALIGNED FIELD-PLATE ISOLATION BETWEEN ACTIVE ELEMENTS

[75] Inventor: Manzur Gill, Arcola, Tex.

[73] Assignee: Texas Instruments Incorporated, Dallas, Tex.

[21] Appl. No.: 787,708

[22] Filed: Nov. 4, 1991

Related U.S. Application Data

[63] Continuation of Ser. No. 715,022, Jun. 13, 1991, abandoned, which is a continuation of Ser. No. 456,907, Dec. 26, 1989, abandoned.

[51] Int. Cl.$^5$ .................. H01L 29/40; H01L 29/68; H01L 27/10
[52] U.S. Cl. .................................. 257/504; 257/316; 257/390
[58] Field of Search ............. 357/53; 257/487, 488, 257/491, 316, 390, 409, 504

[56] References Cited

U.S. PATENT DOCUMENTS

| | | | |
|---|---|---|---|
| 4,455,565 | 6/1984 | Goodman et al. | 357/53 |
| 4,458,262 | 7/1984 | Chao | 357/53 |
| 4,561,170 | 12/1985 | Doering et al. | 357/91 |
| 4,652,898 | 3/1987 | Lange et al. | 357/53 |
| 4,825,278 | 4/1989 | Hillenius et al. | 357/53 |
| 4,947,222 | 8/1990 | Gill et al. | 357/53 |

Primary Examiner—Andrew J. James
Assistant Examiner—Ngan Van Ngo
Attorney, Agent, or Firm—Theodore D. Lindgren; Leo N. Heiting; Richard L. Donaldson

[57] ABSTRACT

The structure and method of this invention provide, for example, electrical isolation between active elements in adjacent rows and/or columns of an integrated circuit by use of a self-aligned field-plate conductor formed over and insulated from the substrate regions that are bounded by the channel regions of field-effect transistors in adjacent rows and that are bounded by the bit-lines forming those transistors in a column. The field-plate conductor is formed, for example, in a strip that extends over the isolation areas and thermal insulator regions between row lines of the memory cell array. The field-plate conductor strip is connected to a voltage supply that has a potential with respect to the potential of the semiconductor substrate which causes the isolation areas to be nonconductive. Component density may be increased over that of prior-art structures and methods.

3 Claims, 4 Drawing Sheets

SELF-ALIGNED FIELD-PLATE ISOLATION BETWEEN ACTIVE ELEMENTS

This application a continuation of application Ser. No. 07/715,022, filed Jun. 13, 1991, now abandoned, which is a continuation of application Ser. No. 07/456,907, filed Dec. 26, 1989, now abandoned.

BACKGROUND OF THE INVENTION

This invention relates to a structure and a method for providing electrical isolation between active elements, such as nonvolatile or other-type memory cells, in an integrated circuit array. More particularly, this invention relates to isolating such active elements through use of a self-aligned field-plate conductor.

Electrical isolation between the channel regions of active elements, such as transistors in adjacent rows of a memory cell array, has been provided by a variety of methods. Electrical isolation regions include, for example, those regions of the semiconductor substrate surface bounded on two opposite sides by channel regions of field-effect transistors in adjacent rows of a memory array and bounded on the other two sides by buried extensions of the source and drain regions in a column of that array.

One previous method of forming isolation regions has been by junction isolation. Junction isolation regions are implanted with a dopant of the same conductivity type as that of the semiconductor substrate. The higher-level doping in the isolation regions reduces the encroachment of depletion layers of reverse-biased diode junctions into the isolation regions. The source/drain implant extensions are formed by doping the substrate with an impurity of opposite conductivity type. A disadvantage of this type of electrical isolation is the relatively high capacitance formed by the reverse-biased junction, which adversely affects speed of operation of the memory array. Another disadvantage is the inability to downscale the size of the isolation region as the density of the memory cells is increased, while at the same time maintaining the same values for operating voltages.

Another previous method for providing electrical isolation has been the use of thermally-grown field-oxide regions. Field-oxide isolation regions are typically formed by implanting the semiconductor substrate surface with an impurity of the same conductivity type as that of substrate, then exposing the surface to steam at high temperature for a relatively long period of time. During the exposure to steam, thick oxide regions form with lower surfaces below the original surface of the substrate and with upper surfaces above that original surface. One of the disadvantages of this type of isolation is that the edges of the thick oxide regions expand into the surrounding regions, such as adjacent channel regions, using space that might otherwise be used for components.

A third previous method for providing electrical isolation has been the use of trenches etched into the substrate regions, with a light junction isolation doping at the bottom surface and vertical surfaces of the trenches. One of the disadvantages of using trench isolation is the difficulty in filling the trenches with an insulator material that provides a planar surface for later formation of metal or other conductors on the memory chip.

Methods using a field-plate conductor for isolating dynamic random access memory cells are described in U.S. Pat. Nos. 4,696,092 and 4,561,170, also assigned to Texas Instruments Incorporated.

It is desirable to provide a structure and method for electrically isolating active elements, such as transistors in a memory cell array, in a manner that results in decreased bitline capacitance, in a manner that allows dimensions to be down-scaled, in a manner that does not encroach on active surface areas, and in a manner that results in a surface structure better suited for later process steps. In particular, it is desirable to provide a structure and method that permits a reduction in the spacing between rows and/or columns of memory cells, but with no increase in bitline capacitance.

SUMMARY OF THE INVENTION

The structures and methods of this invention provide, for example, electrical isolation between nonvolatile memory cells in adjacent rows and/or columns by use of a self-aligned field-plate conductor formed over and insulated from the substrate regions that are bounded by the channel regions of field-effect transistors in adjacent rows and that are bounded by the bitlines forming those transistors in a column. The self-aligned field-plate conductor is formed, for example, in a strip that extends over the isolation areas and insulator regions between row lines, or control electrodes, of the memory cell array. The field-plate conductor strip is connected to a voltage supply that causes the isolation areas to be nonconductive. Component density may be increased over that of prior-art structures and methods because the field-plate conductor strips may be down-scaled in dimension whereas prior-art LOCOS field-oxide isolation strips, for example, may not be down-scaled.

Because the field-plate conductor strips of this invention are self-aligned, the formation of the strips does not require an additional masking step. Therefore, potential problems caused by any misalignment during that step are eliminated.

BRIEF DESCRIPTION OF THE DRAWINGS

The novel features of this invention are set forth in the appended claims. The invention, its features, and its advantages are described below in conjunction with the following drawings:

DESCRIPTION OF THE SPECIFIC EMBODIMENT

Figure 1:
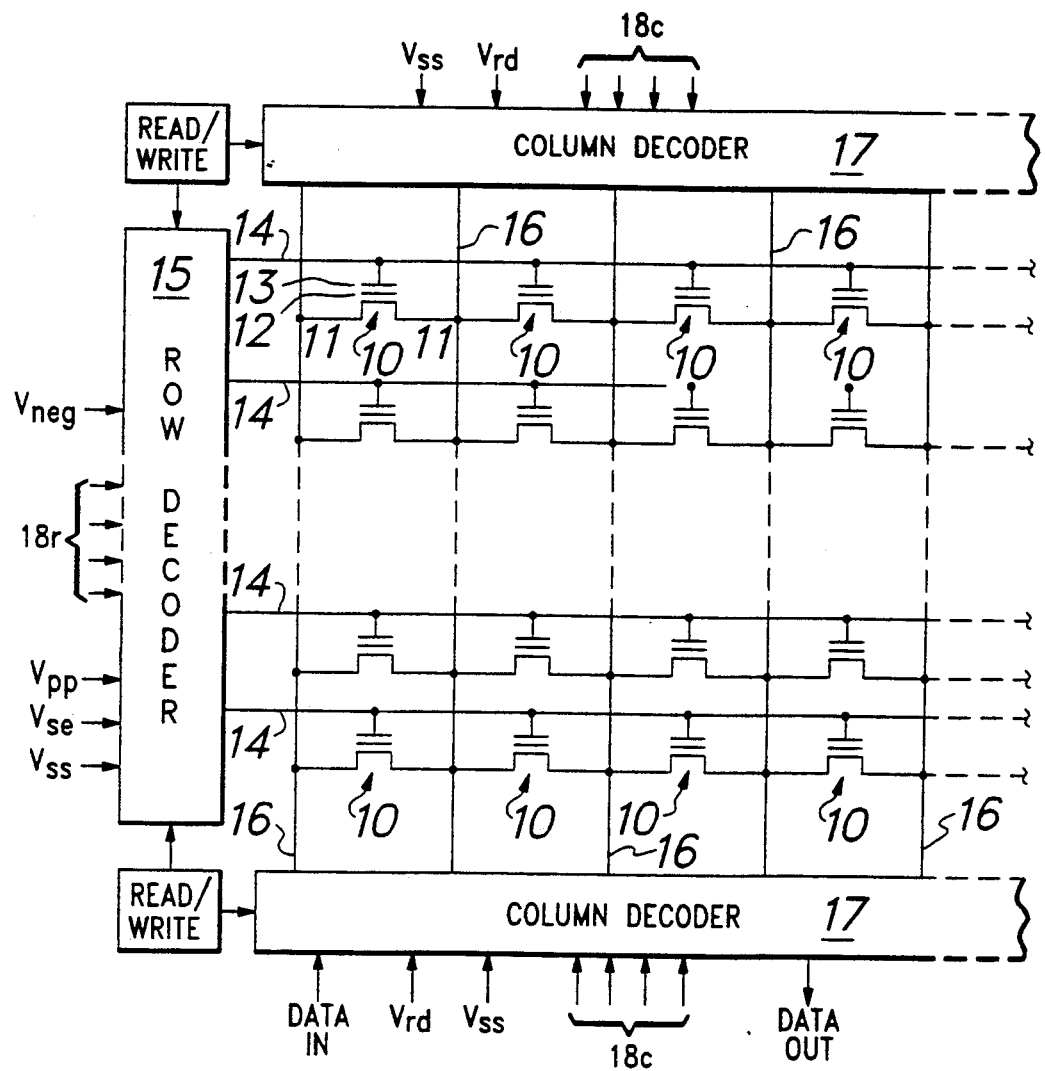
FIG. 1 is a schematic circuit, in partial block form, of an example integrated-circuit, nonvolatile memory array in which the structure and process of this invention may be used.

Referring to FIG. 1, an array of floating-gate, field-effect transistors is shown, the transistors being typical of active elements found in an integrated, nonvolatile memory array. Each floating-gate transistor 10 has two source-drain regions 11, a floating gate 12 and a control gate 13. Each of the gates 13 in a row of cells is connected to a row line 14, and each of the row lines 14 is connected to a row decoder 15. Each of the source-/drain electrodes 11 in a column of cells is connected to a column line 16, and each of the column lines 16 is connected to a column decoder 17.

In a write or program mode, the column decoder 17, in response to column address signals on lines 18c, functions to apply either a low voltage (Vss or ground) to a selected column lines 16. Other column lines 16 may be allowed to float. The row decoder 15 functions, in response to row address signals on lines 18r, to apply a high voltage Vpp to the selected row line 14.

In the read mode, the column decoder 17 functions, in response to column address signals on lines 18c, to apply a positive voltage Vrd and to connect ground (or Vss) to adjacent selected column lines 16. The row decoder 15 functions, in response to row address signals on lines 18r, to apply a positive voltage Vse to the selected row line 14.

Figure 2:
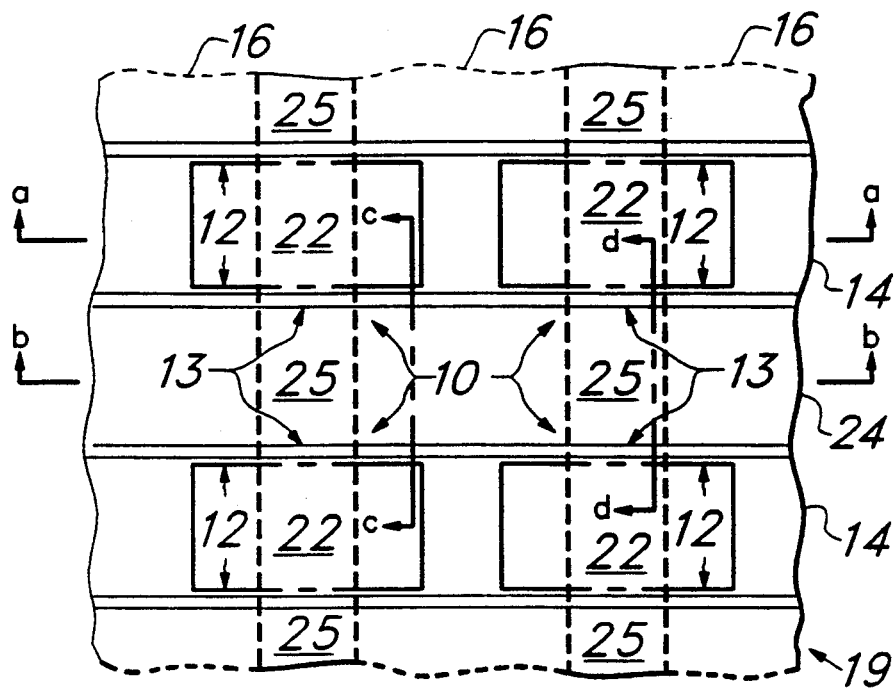
FIG. 2 is a plan view of a part of a semiconductor chip having memory cells according to the circuit of FIG. 1.

Referring now to FIG. 2, only a very small part of the substrate of a memory cell array is shown, it being understood that these cells are part of an array of a very large number of such cells. While electrically programmable memory cells are used for illustration purposes, it should be understood that the process of this invention is equally applicable to all types of memory and other type integrated circuits, including dynamic random access memories and microprocessors.

FIGS. 2 and 3a-3d illustrate an array of nonvolatile memory cells 10 in a face or layer of a semiconductor body, such as a silicon substrate 19 doped with a P-type of impurity. Only a very small part of the substrate 19 is shown in the FIGs., it being understood that these cells 10 are part of an array of a very large number of such cells 10. A number of control gates 13/row lines 14 are formed by second-level doped polycrystalline silicon (polysilicon) strips extending along the face of the substrate 19. Control-gate conductors 13 are separated from floating-gate conductors 12 by inter-level insulator layers 20. Column lines, or bitlines, 16 are formed beneath thermal oxide regions 21 in the face, parallel to and spaced from each other. These buried bitlines 16 include the source-drain regions 11 of each of the cells 10. A floating-gate conductor 12 for each cell 10 is formed by a first-level doped polysilicon layer extending across, and insulated from, a channel region 22 between spaced-apart source-drain regions 11. Each floating-gate conductor 12 also extends over at least a part of both thermal oxide regions 21. A gate insulator, such as an oxide layer, 23 is formed over the channel region 22. Two edges of the floating-gate conductor 12 for a cell 10 are aligned with the edges of a row line 14. For explanatory purposes, the edges are illustrated in FIG. 2 as being slightly misaligned.

The capacitance between control-gate conductor 13 and floating-gate conductor 12, compared to the capacitance between floating-gate conductor 12 and a source-drain region 11 or substrate 19, is more favorable because the floating-gate conductor 12 extends out across relatively thick thermal oxide regions 21. Therefore, a larger fraction of the voltages applied between control gate 13 and a source-drain region 11 will appear between floating-gate conductor 12 and a source-drain region 11.

The cell 10 is referred to as "contact-free" in that no source-drain contact is needed in the vicinity of cell 10 itself.

The channels 22 of cells 10 in adjacent rows are electrically isolated by self-aligned field-plate conductor 24, which may be of doped polysilicon and which extends over and is insulated from the regions 25 between channel areas 22. Field-plate conductor 24 is connected to a source of potential that is equal to, or more negative than, the potential of the P-type substrate regions 25, biasing those areas to be nonconductive. Field-plate conductor 24 is electrically insulated from the control electrodes, floating-gate conductors 12 and control-gate conductors 13, by a sealing insulator coating (not shown) and by optional sidewall insulator spacers 26, which may be formed using silicon oxide.

Note that the array of cells 10 is of the "virtual-ground-circuit" type; that is, each source-drain region 11 of each cell 10 shares a bitline 16 with a source-drain region 11 of an adjacent cell 10. However, the structure and process of this invention are also applicable to arrays with dedicated bitlines 16 for source-drain regions 11, and are also applicable whether or not those source-drain regions 11 are parts of bitlines 16 buried under thermal oxide regions 21. The structure and process of this invention are also applicable to memory arrays comprising single-gate cells that are permanently programmed during the manufacturing process. In addition, the structure and process of this invention are applicable where columns of cells 10 are isolated by LOCOS thick field oxide strips, not illustrated here.

Referring now to FIGS. 4a-4f, the starting material for constructing the example device is a slice or layer of silicon, doped with a P-type impurity, of which the substrate 19 is only a very small portion. The slice is perhaps 6 inches in diameter, while the portion shown in FIGS. 3 and 4a-4e is only a few microns wide. A number of process steps would be performed to create transistors peripheral to the array, and these will not be discussed here. For example, the memory device may be of the complementary field-effect type having N-wells and P-wells formed in the substrate as part of a prior process to create peripheral transistors.

Figure 4A:
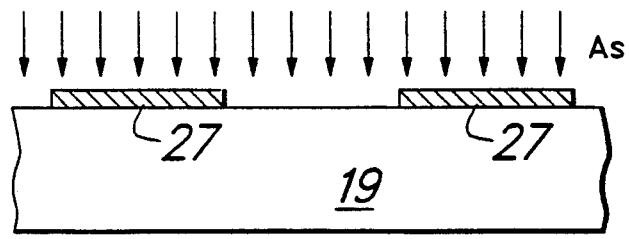
FIGS. 4a-4f are elevation views in section of the semiconductor device of FIGS. 2 and 3a-3d at various stages of construction taken along lines a—a of FIG. 2.

In reference to FIG. 4a, the first step related to the cell array of the invention is patterning substrate 19 with photoresist 27. An arsenic implant (As) is performed at a dosage of about $6 \times 10^{15}$ cm$^{-2}$ at 135 KeV, using photoresist as an implant mask, to create the bitlines 16, which include source-drain regions 11.

Figure 4B:
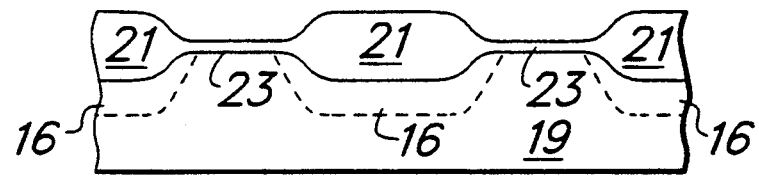

As illustrated in FIG. 4b, oxide regions 21 are grown on the face to a thickness of about 2500 to 3500A over the N+ buried bitlines 16, during which time a thermal gate oxide 23 of about 300A will grow over the channel areas due to the differential oxidation occurring when heavily-doped and lightly-doped silicon areas are exposed to oxidation at the same time. This oxidation is in steam at about 800° to 900° C.

Figure 4C:
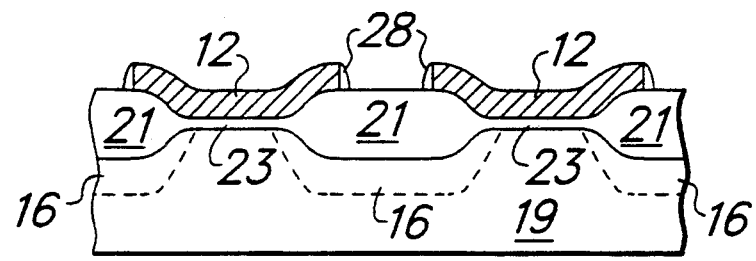

In reference to FIG. 4c, a first conductive layer, which may be of N+ doped polysilicon, is applied to the semiconductor structure 19, patterned and etched to leave strips that will form floating gates 12 of the memory cells 10. Sidewall oxide regions 28 may be formed at the exposed edges of floating gate strips 12 using conventional methods.

Figure 3A:
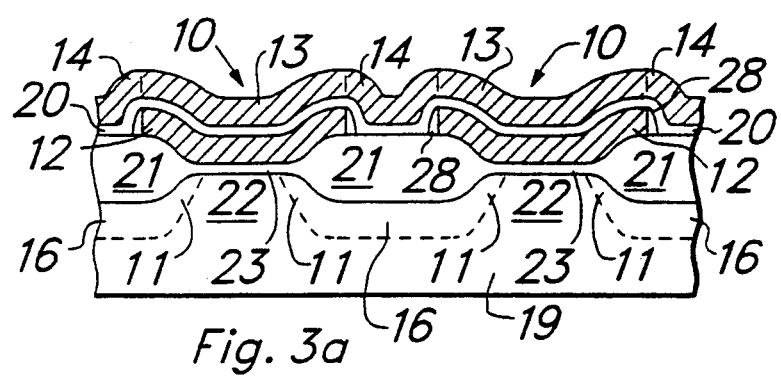
FIGS. 3a-3d are elevation views in section taken along lines a—a, b—b, c—c and d—d of FIG. 2.
Figure 3B:
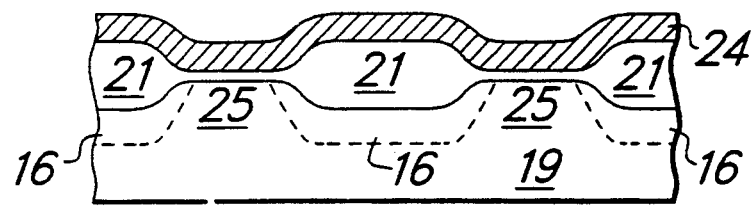
Figure 3C:
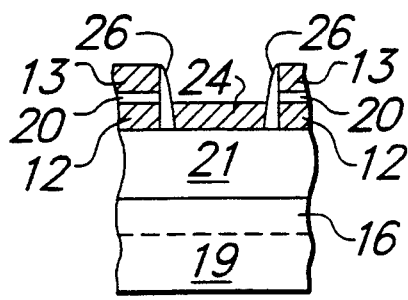
Figure 3D:
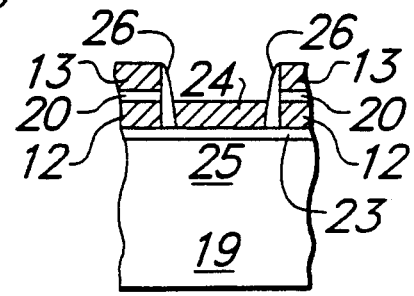
Figure 4D:
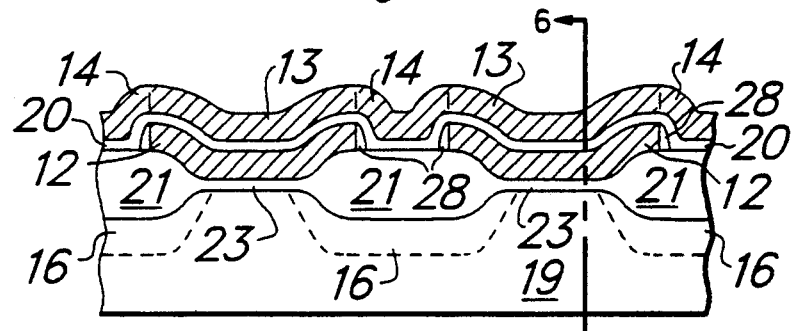

Referring now to FIG. 4d, an inter-level insulator layer 20, which may be oxide, or oxide-nitride-oxide, is then formed over what will become floating gates 12. A second conductive layer, which may also be of N+ doped polysilicon, is then deposited over inter-level insulating layer 20. The second conductive layer will become control gates 13/row lines 14. The structure is then covered with a layer of photoresist which is patterned and subjected to an etching cycle such that the second conductive layer, inter-level insulator layer 20, and floating gate strips 12 are etched to form control gates 13/row lines 14 separated by inter-level insulator layers 20 from floating gates 12, as illustrated in FIGS. 3c and 3d. The etching extends at least to the depth of gate insulator layer 23. Edges of the floating gates 12 are aligned with edges of the control gates 13/row lines 14, although the edges illustrated in FIG. 2 are offset slightly for illustration purposes.

The structure may now be subjected to an oxide-growing cycle to form an insulating layer (not shown) of silicon oxide on the exposed edges of floating gates 12 to aid in charge retention. The exposed edges and the top of control gates 13/row lines 14 are also covered with the same layer of silicon oxide. A light boron implant may be performed either after the stack etch or after this oxidation step to increase the P-type impurity concentration in the areas 25 between control gates 13/row lines 14. Optional sidewall insulator spacers 26, as illustrated in FIGS. 3c, 3d, 5a and 5b, may then be formed using conventional procedures.

Figure 4E:
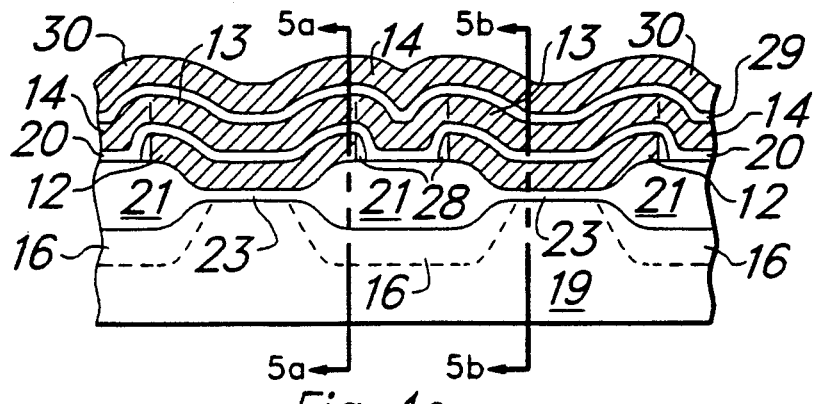
Figure 5A:
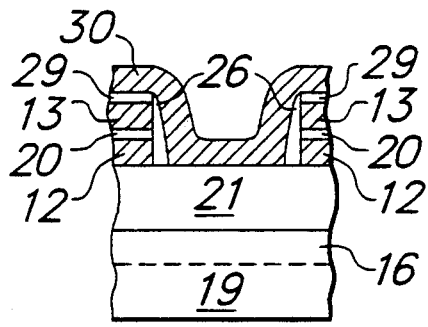
FIGS. 5a-5b are elevation views in section of the semiconductor device stage of FIG. 4e taken along lines 5a—5a and 5b—5b respectively.
Figure 5B:
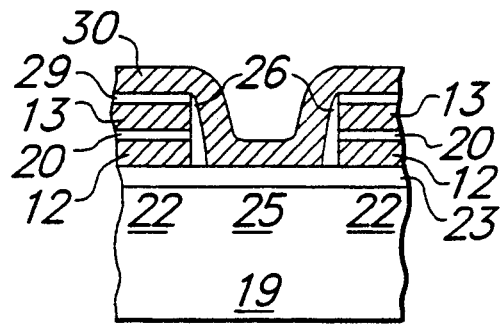

Referring now to FIG. 4e, 5a and 5b, nonconductive layer 29 is formed over the structure, followed by a third conductive layer of polysilicon 30, doped N+. This third layer 30 will form self-aligned field-plate strips 24 of FIGS. 3c and 3d between control gates 13/row lines 14. The strips 24 may be formed with a common electrical connection to a conductive strip (not shown) at the edge of the array and the common strip may be electrically connected to a reference or other potential sufficient to cause the semiconductor regions under the strips to be nonconductive.

Figure 4F:
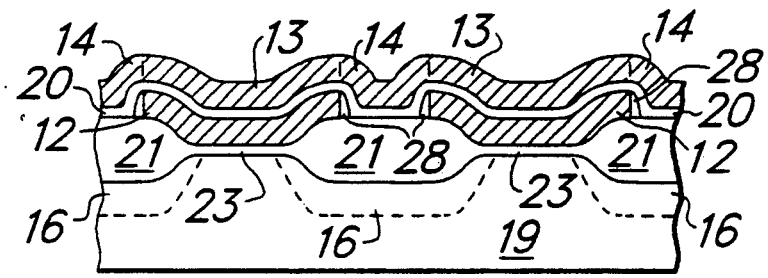

Referring now to FIG. 4f, 3c and 3d, the part of polysilicon layer 30 overlying control gates 13/row lines 14 is removed by an etching procedure, such as resist etch-back, to leave self-aligned field-plate strips 24 overlying isolation regions 25. The self-aligned field-plate strips 24 may be connected at one end for further connection to a source of bias potential that renders regions 25 nonconductive.

Figure 6A:
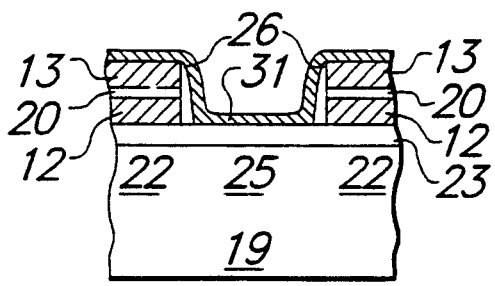
FIGS. 6a-6b are elevation views in section of the semiconductor device of FIG. 4d taken along lines 6—6 at later stages of a process for constructing an alternative embodiment of the device of this invention.
Figure 6D:
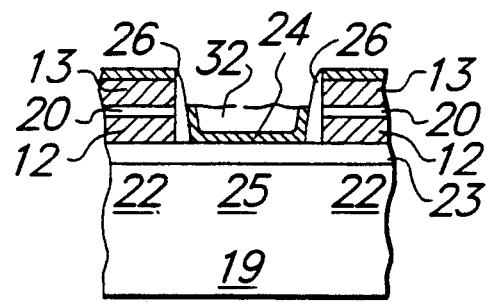

In reference to FIGS. 6a-6b, an alternative method of forming self-aligned field-plate conductor strips 24 is illustrated. FIG. 6a illustrates the structure of FIG. 4d after formation of optional sidewall insulator regions 26 and after depositing of a conductive layer 31, such as titanium silicide, titanium, or another refractory metal, on the upper surface. The structure is then subjected to a short heat cycle, during which the refractory metal layer 31 reacts with the control gate 13/row line 14 conductor, but not with silicon oxide surfaces between row lines, including sidewall insulator regions 26, gate insulator layer 23 and thermal oxide regions 21.

In reference to FIG. 6b, an insulating layer, such as silicon dioxide, is then deposited on the entire structure. The structure is then subjected to an etch-back procedure according to known procedures to leave an insulating strip 32 over the conductive layer 31 of FIG. 6a between control gates 13/row lines 14. This etch is continued for a sufficient length of time that the insulating layer is removed from the upper edges of sidewall insulator regions 26. The upper surface of the structure is then subjected to a wet etch according to known procedures to remove refractory metal layer 31 from the upper edges of sidewall insulator regions 26 and any un-reacted silicide material from the upper surfaces of control gates 13/row lines 14. The silicide remaining under insulating layer 32 forms self-aligned field-plate conductors 24.

After completing either embodiment, the structure may then be covered with a layer of oxide, which is made planar. Contact holes are formed, followed by metal and protective overcoat processes.

It should be noted that the FIGs. are not drawn to scale and that, in particular, the thicknesses of the first and second polysilicon layers are generally much greater than the thicknesses of insulator layers 20 and 23.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. An isolating structure between control electrodes of active elements of an integrated circuit, each of said control electrodes having at least one edge and having a sidewall insulator adjacent said edge, comprising:
    a semiconductor substrate region between a said edge of a said control electrode and a said edge of an adjacent said control electrode;
    an insulator layer overlying said semiconductor substrate region; and
    a field-plate conductor overlying said insulator layer and abutting said sidewall insulator, said field-plate conductor electrically insulated from at least a said edge of said control electrode by said sidewall insulator.

2. An isolating structure between control electrodes of active elements of memory cells in an array of said cells, said control electrodes having sidewall insulators, comprising:
    a semiconductor layer between said control electrodes;
    a field-plate formed over and insulated from said semiconductor layer, insulated from said control electrodes by said sidewall insulators, and abutting said sidewall insulators; said field-plate connected to a source of electric potential that, in relation to the electric potential of said semiconductor layer, causes said semiconductor layer to be nonconductive.

3. A nonvolatile memory array comprising rows and columns of active elements formed on the surface of said semiconductor layer, each said element having a control electrode defining a channel region in said surface, said control electrode having adjacent sidewall insulators, said channel region spaced apart by a semiconductor region from a channel region of a said active element of an adjacent row, including:
    a field-plate formed over and insulated from said semiconductor region, said field-plate abutting said sidewall insulators and electrically insulated from said control electrodes by said sidewall insulators.

* * * * *